May 2, 1950 E. TOTH 2,505,813

SELECTIVE AMPLIFIER SYSTEM

Filed Aug. 3, 1945 3 Sheets-Sheet 1

Inventor
EMERICK TOTH

By Ralph L. Chappell

Attorney

May 2, 1950 E. TOTH 2,505,813

SELECTIVE AMPLIFIER SYSTEM

Filed Aug. 3, 1945 3 Sheets-Sheet 2

Inventor
EMERICK TOTH

By Ralph L. Chappell

Attorney

Inventor
EMERICK TOTH

By Ralph W. Chappell
Attorney

Patented May 2, 1950 2,505,813

UNITED STATES PATENT OFFICE 2,505,813

SELECTIVE AMPLIFIER SYSTEM

Emerick Toth, Takoma Park, Md.

Application August 3, 1945, Serial No. 608,822

4 Claims. (Cl. 179—171)

(Granted under the act of March 3, 1883, as amended April 30, 1928; 370 O. G. 757)

This invention relates to high frequency multistage selective amplifier systems in which negative electromagnetic feedback is employed to stabilize operation and thereby prevent regeneration.

An object of this invention is to provide a high frequency band selective amplifier and chassis layout arranged to prevent regeneration produced as a result of coupling between stages or non-uniform ground potential, whereby full use of available chassis space is attainable.

Another object of this invention is to provide a multi-stage high frequency amplifier system arranged so as to provide degenerative feedback in combination with means for controlling such feedback.

A further object of this invention is to provide a high frequency selective amplifier arranged so as to provide degenerative feedback produced as a result of electromagnetic coupling between adjacent stages together with means for controlling the amount of feedback, and for minimizing feedback between certain component parts operating at a net phase difference which is something other than 180 degrees.

Another object of this invention is to reduce the length of the chassis of a high frequency amplifier so that it will be a small percentage of the wavelength employed, thus minimizing the radio frequency potential difference which normally exists between opposite ends of the amplifier.

Other objects and features of this invention will become apparent upon a careful consideration of the following detailed description when taken together with the accompanying drawings.

In general, the invention provides a high frequency amplifier layout and design in which negative electromagnetic feedback is produced and controlled to facilitate the construction of high frequency amplifier systems. A suitable mounting chassis is provided on which the successive stages of a multi-stage amplifier may be arranged so that the input and output satges lie in physical proximity. Interstage connections are made so that an electrical phase difference of 180° exists between the input and output stages. The external lead connections associated with these stages are looped to accentuate the magnetic flux produced thereby, and suitable shielding means are provided to control the amount and select the phase of electromagnetic feedback and thus preserve the gain of the amplifier.

Figure 1:
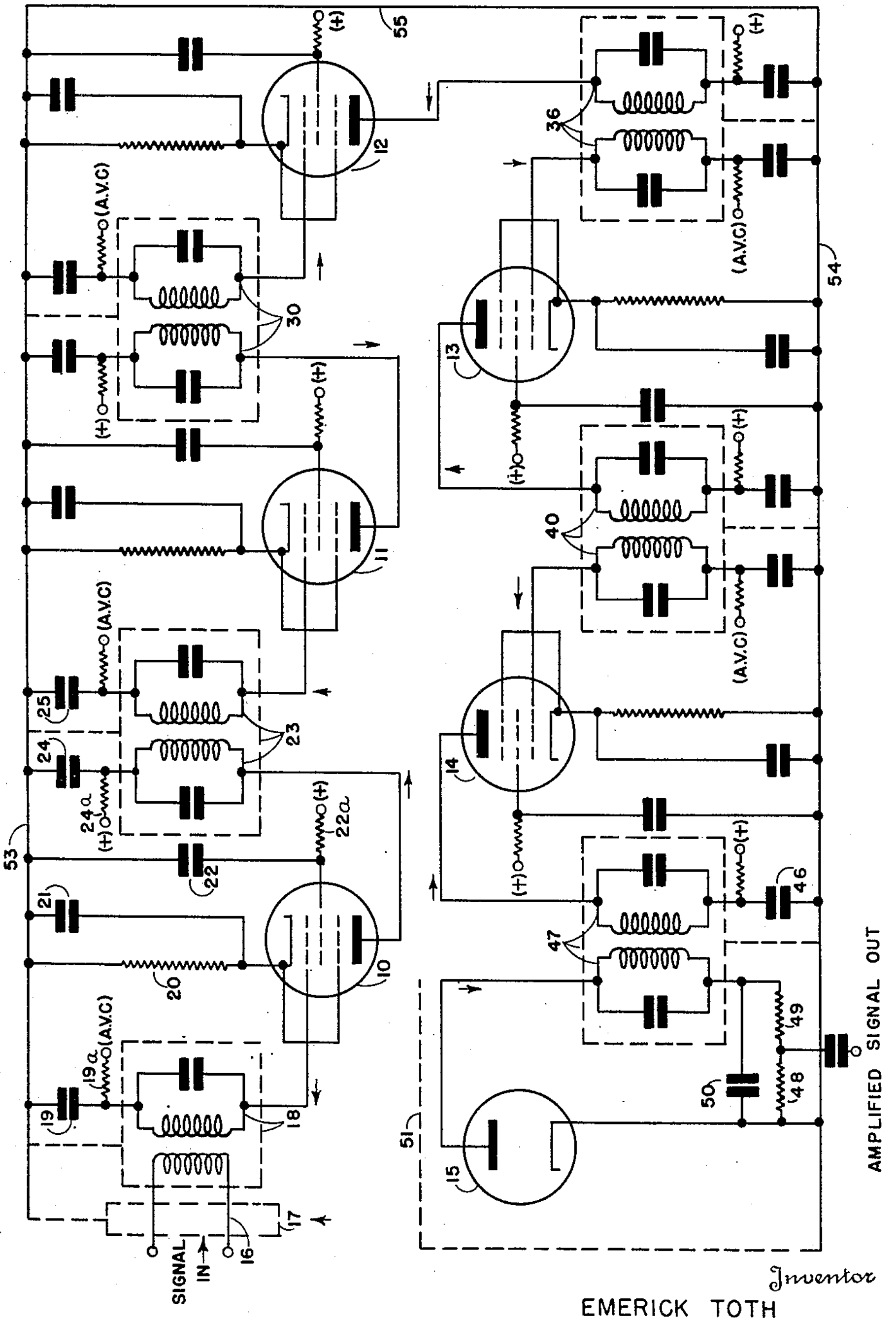
Fig. 1 is a circuit diagram of an "intermediate frequency" amplifier connected according to the principles of the present invention.

With particular reference to Fig. 1, the circuit diagram of a typical multi-stage intermediate frequency amplifier system with interstage transformer coupling is disclosed, comprising vacuum tubes 10, 11, 12, 13, 14, 15, and coupling transformers 18, 23, 30, 36, 40, 47. Connections to each stage are made according to conventional intermediate frequency amplifier design and are typified at stage 10 by the cathode biasing combination 20, 21, the screen by-pass capacitance 22 and decoupling resistance 22—*a*, the plate supply by-pass 24 and decoupling resistance 24—*a*, and the automatic volume control by-pass 19 and decoupling resistance 19—*a*. Interstage transformers 23, 30, 36, 40, 47 are enclosed within shielding cans as represented by the associated dotted lines and are of the double tuned variety to provide band-pass action. The input transformer 18, however, is single tuned, and link-coupled by means of winding 16 to an external signal source (not shown) whose output is to be amplified.

Figure 2:
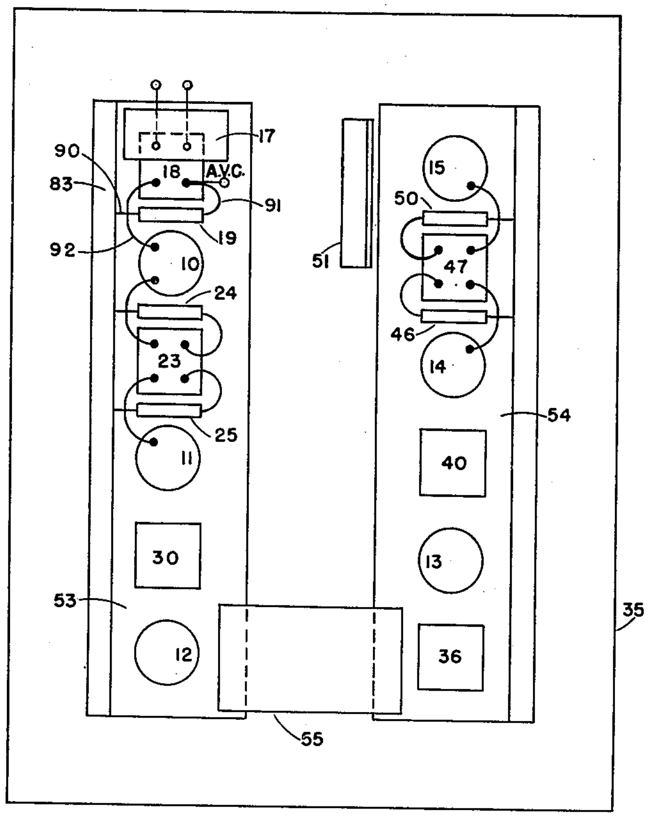
Fig. 2 is an elevational view of the physical layout of some of the major parts of the circuits of Fig. 1.
Figure 3:
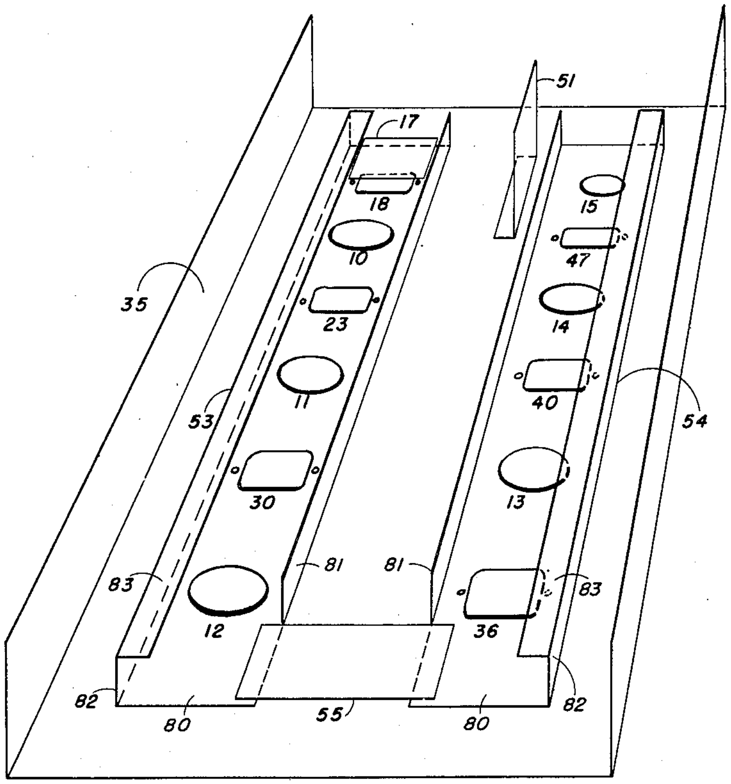
Fig. 3 is a perspective view showing in part Fig. 2.

All ground connections are made to a pair of silver-plated copper grounding strips which are placed in parallel relation on the underneath side of the main chassis member. These strips 53 and 54 in combination with the main chassis 35 are shown in Figs. 2 and 3. The strips 53 and 54 are described in copending application S. N. 587,200, filed April 7, 1945, by Thomas M. Davis, entitled "Electrical connecting fixture," and issued May 3, 1949, as U. S. Patent No. 2,468,737. As shown in Fig. 3, these strips comprise a body portion 80 in which the tube socket and interstage transformer holes are cut, a first integral flat shielding strip 81 extending at right angles to the body portion 80, a second integral flat shielding strip 82 also extending at right angles to the body portion 80 and an integral inwardly extending member 83. Also as shown in Fig. 3 the strips are mounted in parallel relationship underneath a main chassis member 35 and are electrically joined at one end by a flat metallic member 55.

To better illustrate the production of degenerative feedback as a result of coupling between input and output stages it is necessary to trace the phase shift occurring through the amplifier. It is well known that the voltage produced across the secondary of an ordinary transformer bears a phase relationship of either 0 degrees or 180 degrees with respect to the voltage impressed across the primary depending upon the phasing of the leads to the windings. In a tuned transformer, however, the charging of the resonating capacitance placed across the secondary of the transformer winding produces an additional phase displacement of 90 degrees resulting in an overall phase displacement of the secondary voltage with respect to the primary voltage of either 90 degrees or 270 degrees depending upon the connections to the transformer. In this particular illustration, all transformers have been connected in the circuit in a manner that will produce a net displacement of 90 degrees with the exception of transformer 47 which, for reasons shown later, is connected to produce a net displacement of 270 degrees. The normal action of a plate loaded vacuum tube results in the production, at the plate of that tube, of a voltage which is usually amplified and inverted with respect to the signal applied to the grid. Thus, although obviously incorrect, it is commonly stated that, when operating upon a sine wave signal, the tube produces an output voltage which is displaced from the grid voltage by 180 degrees. This displacement, as is the case of all phase displacements hereinafter mentioned, is considered as a lagging phase displacement.

In determining the phase shift occurring between input and output circuits according to the principles outlined above, an initial or zero phase displacement condition may be assumed to exist at the input winding 16 shown in Fig. 1. The voltage applied to the grid of tube 10 will then be displaced by 90 degrees due to the action of transformer 18. An additional displacement of 180 degrees occurs in tube 10 causing the voltage applied across the primary of transformer 23 to be displaced from that of the input circuit 16 by a total of 270 degrees. This accumulation of phase shift may be followed through the amplifier where it is evident that the voltage at the primary of transformer 47 is displaced from the voltage applied to the input winding 16 by a total of 1350 degrees which may be considered equivalent to 270 degrees. Since the secondary voltage of transformer 18 is displaced 90 degrees with respect to the input voltage, the net result is a phase displacement of 180 degrees between the secondary of transformer 18 and the primary of transformer 47.

As mentioned above, the connections to transformer 47 are such that the 180 degree phase displacement between primary and secondary voltages occurs in addition to the 90 degree displacement. Thus a total displacement of 1620 degrees or the equivalent of 180 degrees displacement exists between the voltage at the winding 16 and the voltage across the detector 15.

To aid in the interpretation of this discussion, relative indications, arrowheads, are shown in Fig. 1 in proximity to the circuits to which they apply, oriented in a direction which is representative of the relative phase displacements existing in the circuit.

According to the invention the successive components as shown in particular in Fig. 2, are positioned in a hairpin fashion, i. e. the stages of the amplifier are placed up one leg of the hairpin and down the other on the parallel ground fixtures 53 and 54 so that the initial stages of the amplifier are opposite the final stages whereby electromagnetic feedback is produced.

Negative electromagnetic feedback between the input and output stages may be accentuated by proper placement of parts in parallel relationship and by looping the associated lead wires so as to form single turn inductances. As indicated in Fig. 2, which is an under-side view of an actual layout of the amplifier, the plate and grid decoupling capacitances, particularly the capacitances 19, 24, 25, 46 and 50 in the initial and final stages of the amplifier are mounted below the level of the tube sockets and transformer leads. As typified by the connections to capacitance 19 and input transformer 18, single turn inductances are formed by each of these capacitances and the leads to them in the following manner: One lead 90, for example, of the capacitance 19 is grounded by its connection to the inwardly extending flat member 83 of the ground strip 53, the other lead 91 is connected to the automatic volume control terminal of transformer 18. The grid lead 92 from transformer 18 to the grid pin on the socket of tube 10 is in turn a loop connection. Magnetic flux linkage between these single turn inductances as well as a certain amount of magnetic flux linkage between the transformers 18 and 47 due to leakage through the transformer shield cans produces the negative feedback by reason of their relative phase relations. Although it is not absolutely necessary to the proper operation of the circuit, the plate and automatic volume control decoupling capacitances are similarly looped for all stages for the sake of uniformity.

As was previously shown, degenerative coupling exists between the primary circuit of transformer 18 and the secondary circuit of 47 as well as between the secondary circuit of 18 and the primary circuit of 47. It was found that when the mounting strips 53 and 54 were positioned in very close proximity for optimum utilization of chassis space, excessive feedback resulted with an attendant distortion of the symmetrical frequency selectivity characteristic. Therefore to control the negative feedback a partial shield 17, which comprises a flat metallic sheet, was fixed, screwed for example, over the primary leads of the input transformer 18 as shown in Fig. 2 reducing the amount of feedback between the input loop 16 and the secondary circuit of transformer 47.

In some instances it is desirable to omit the input transformer 18 entirely, coupling directly to the grid of tube 10. In this event the coupling between the circuit of the detector 15 and the primary of transformer 18 does not exist. Also the strong 90 degree feedback component between the circuit of detector 15 and the input circuit of tube 10 is not neutralized by a 90 degree component of opposite relationship between the primary of transformer 47 and the primary of transformer 18. Although this 90 degree component cannot directly produce regenerative action at the mid-frequency of the selectivity curve, it is undesirable because it may produce some distortion of the shape of the frequency selectivity characteristic or other ill-effects. It was found, however, that the effect of this field can be minimized by the insertion of a shield between input and output stages, tubes 10 and 15 respectively. In the present illustration a simple flat metallic member 51 screwed to the main chassis member 35 and extending downward at right angles thereto, for substantially the depth of the main chassis 35 and adjacent to the output stage 15 was found to be sufficient to suppress the 90 degree components of the feedback and permit the 180 degree components between grid of tube 10 and plate of tube 14 to influence the operation of the circuit.

Furthermore it should be noted that the phase shifts as mentioned here are correct for the mid-frequency of the selectivity curve of the tuned-circuits at which point the tuned circuits act as pure resistances producing zero phase shifts. Either above or below the mid-frequency, the resonant circuits appear reactive in nature and therefore produce additional phase shifts. Difficulty in the phasing of the feedback components because of this additional shift is avoided primarily by the selectivity characteristics of the tuned circuits. At extremities on the selectivity curve, where added phase shifts would produce in-phase feedback, the response of the amplifier is so low as to prevent oscillation.

Fig. 3 is a perspective view of the underneath side of the amplifier chassis showing more clearly the location of the major parts and their physical relationship, the partial shields 17, 51, and the high conductivity grounding strips 53, 54, 55.

Where it is desired to sacrifice some overall gain for simpler mechanical structure, the high conductivity grounding strips 53, 54, 55 may be omitted, ground connections being made directly to the main chassis member 35.

From the foregoing discussion it is apparent that considerable modification of the basic invention is possible without exceeding the scope of the invention, therefore, the invention is not to be limited except by the spirit of the prior art or the scope of the appended claims.

The invention described herein may be manufactured and used by or for the Government of the United States of America for governmental purposes without the payment of any royalties thereon or therefor.

What is claimed is:

1. In combination, a chassis member, a multi-stage high frequency amplifier system so positioned on said chassis that the input and output circuits of said amplifier lie in physical proximity one to the other, transformer type interstage connections between succeeding stages of said amplifier, said interstage connections being poled to provide phase opposed electromagnetic fields associated with said input and output circuits, selected lead wires in said input and output circuits being disposed beneath the chassis and looped in the form of single turn inductances to provide degenerative coupling between said input and output stages, and shielding means interposed between said input and output circuits, said shielding means arranged to control the amount and select the phase of electromagnetic coupling existing between said input and output circuits.

2. In a multi-stage transformer coupled high frequency amplifier system having input and output stages; the combination of, a main chassis member having a series of tube sockets and transformer holes cut therein in two parallel lines, said tube sockets and transformer holes being adapted to receive the corresponding components of said amplifier in such an order as to place the input and output stages of said amplifier at adjacent ends of said parallel lines, the connections to successive stages of said amplifier being poled to produce phase opposed magnetic fields associated with said input and output stages, selected lead wires in said input and output circuits being disposed beneath the chassis and looped in the form of single turn inductances to provide degenerative coupling between said input and output stages, and a shielding means disposed beneath said chassis member adjacent to said output stage, said shielding means comprising a flat metallic member extending at right angles to said chassis member.

3. In a multi-stage transformer coupled high frequency amplifier system having input and output stages; the combination of a main chassis member having a series of tube sockets and transformer holes cut therein in two parallel lines, said tube sockets and transformer holes being adapted to receive the corresponding components of said amplifier in such an order as to place the input and output stages of said amplifier at adjacent ends of said parallel lines, the connections to successive stages of said amplifier being poled to produce phase opposed magnetic fields associated with said input and output stages, selected lead wires in said input and output circuits being disposed beneath the chassis and looped in the form of single turn inductances to provide degenerative coupling between said input and output stages, the lead wires connecting an input signal to said input transformer being disposed beneath said chassis member, and a shielding means to limit the amount of degenerative coupling comprising a flat metallic member so disposed beneath said chassis member with its principal plane parallel to said chassis member as to provide a space between itself and said chassis member in which said lead wire may be housed and shielded thereby.

4. In a multi-stage transformer coupled high frequency amplifier system having input and output stages; the combination of, a main chassis member, a pair of grounding fixtures of the class described mounted in parallelism on the under side of said main chassis member and adapted to receive the components of said amplifier in such an order as to place the input and output stages of said amplifier at adjacent ends of said fixtures, the connections to successive stages of said amplifier being poled to produce phase opposed magnetic fields associated with said input and output stages, selected lead wires in said input and output circuits being disposed beneath the chassis and looped in the form of single turn inductances to provide degenerative coupling between said input and output stages, and a shielding means disposed beneath said chassis member adjacent to said output stage, said shielding means comprising a flat metallic member extending at right angles to said chassis member.

EMERICK TOTH.

REFERENCES CITED

The following references are of record in the file of this patent:

UNITED STATES PATENTS

| Number | Name | Date |
|---|---|---|
| 1,940,769 | Potter | Dec. 26, 1933 |
| 2,066,674 | Dunmore | Jan. 5, 1937 |
| 2,232,064 | Hannemann | Feb. 18, 1941 |
| 2,245,379 | Barton | June 10, 1941 |